United States Patent
Biberger et al.

(10) Patent No.: US 6,890,853 B2
(45) Date of Patent: May 10, 2005

(54) METHOD OF DEPOSITING METAL FILM AND METAL DEPOSITION CLUSTER TOOL INCLUDING SUPERCRITICAL DRYING/CLEANING MODULE

(75) Inventors: Maximilian A. Biberger, Palo Alto, CA (US); Paul E. Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 318 days.

(21) Appl. No.: 09/841,800

(22) Filed: Apr. 24, 2001

(65) Prior Publication Data

US 2002/0001929 A1 Jan. 3, 2002

Related U.S. Application Data

(60) Provisional application No. 60/199,580, filed on Apr. 25, 2000.

(51) Int. Cl.[7] .............................. H01L 21/44
(52) U.S. Cl. ...................... 438/670; 438/687; 438/906; 134/1.2; 134/1.3; 134/60
(58) Field of Search ................... 438/687, 906, 438/680, 670, 675, 677, 685; 135/11, 105, 22.18, 60, 1.2, 1.3, 61

(56) References Cited

U.S. PATENT DOCUMENTS

| | | | |
|---|---|---|---|
| 2,439,689 A | 4/1948 | Hyde et al. | |
| 2,617,719 A | 11/1952 | Stewart | ......... 23/312 |
| 3,890,176 A | 6/1975 | Bolon | ............ 156/2 |

(Continued)

FOREIGN PATENT DOCUMENTS

| | | | |
|---|---|---|---|
| DE | 39 04 514 C2 | 8/1990 | ....... D06L/1/00 |
| DE | 40 04 111 C2 | 8/1990 | ....... D06L/1/00 |
| DE | 39 06 724 C2 | 9/1990 | ....... D06P/1/90 |

(Continued)

OTHER PUBLICATIONS

US 6,001,133, 12/1999, DeYoung et al. (withdrawn)
US 6,486,282, 11/2002, Dammel et al. (withdrawn)
J.B. Rubin et al. "A Comparison of Chilled DI Water/Ozone and Co2–Based Supercritical Fluids as Replacements for Photoresist–Stripping Solvents" 1998, pp. 308–314, IEEE/CPMT Int'l Electronics Manufacturing Technology Symposium.

(Continued)

*Primary Examiner*—Caridao Evermart
(74) *Attorney, Agent, or Firm*—Haverstock & Owens LLP

(57) ABSTRACT

A method of depositing a metal film on a substrate includes a supercritical preclean step, a supercritical desorb step, and a metal deposition step. Preferably, the preclean step includes maintaining supercritical carbon dioxide and a chelating agent in contact with the substrate in order to remove an oxide layer from a metal surface of the substrate. More preferably, the preclean step includes maintaining the supercritical carbon dioxide, the chelating agent, and an acid in contact with the substrate. Alternatively, the preclean step includes maintaining the supercritical carbon dioxide and an amine in contact with the oxide layer. The desorb step includes maintaining supercritical carbon dioxide in contact with the substrate in order to remove adsorbed material from the substrate. The metal deposition step then deposits the metal film on the substrate without exposing the substrate to an oxidizing material which oxidizes the metal surface of the precleaned substrate and without exposing the substrate to a nonvolatile adsorbing material which adsorbs to the substrate. An apparatus for depositing the metal film on a substrate includes a transfer module, a supercritical processing module, a vacuum module, and a metal deposition module. The supercritical processing module is coupled to the transfer module. The vacuum module couples the metal deposition module to the transfer module. In operation, the apparatus for depositing the metal film performs the supercritical preclean step, the supercritical desorb step, and the metal deposition step.

45 Claims, 2 Drawing Sheets

U.S. PATENT DOCUMENTS

| | | |
|---|---|---|
| 3,900,551 A | 8/1975 | Bardoncelli et al. ............ 423/9 |
| 4,029,517 A | 6/1977 | Rand ........................... 134/11 |
| 4,091,643 A | 5/1978 | Zucchini ..................... 68/18 C |
| 4,219,333 A | 8/1980 | Harris ........................... 8/137 |
| 4,341,592 A | 7/1982 | Shortes et al. .............. 156/643 |
| 4,349,415 A | 9/1982 | DeFilippi et al. |
| 4,474,199 A | 10/1984 | Blaudszun .................. 134/105 |
| 4,475,993 A | 10/1984 | Blander et al. ............ 204/64 T |
| 4,601,181 A | 7/1986 | Privat ......................... 68/18 C |
| 4,693,777 A | 9/1987 | Hazano et al. .............. 156/345 |
| 4,749,440 A | 6/1988 | Blackwood et al. ........ 156/646 |
| 4,788,043 A | 11/1988 | Kagiyama et al. ........... 422/292 |
| 4,838,476 A | 6/1989 | Rahn ...................... 228/180.1 |
| 4,865,061 A | 9/1989 | Fowler et al. ............... 134/108 |
| 4,877,530 A | 10/1989 | Moses ........................ 210/511 |
| 4,879,004 A | 11/1989 | Oesch et al. ................... 203/89 |
| 4,917,556 A | 4/1990 | Stark et al. .................. 414/217 |
| 4,923,828 A | 5/1990 | Gluck et al. ................. 437/225 |
| 4,924,892 A | 5/1990 | Kiba et al. .................. 134/123 |
| 4,925,790 A | 5/1990 | Blanch et al. |
| 4,933,404 A | 6/1990 | Beckman et al. ........... 526/207 |
| 4,944,837 A | 7/1990 | Nishikawa et al. ......... 156/646 |
| 4,960,140 A | 10/1990 | Ishijima et al. ............... 134/31 |
| 4,983,223 A | 1/1991 | Gessner ..................... 134/25.4 |
| 5,011,542 A | 4/1991 | Weil ............................ 134/38 |
| 5,013,366 A | 5/1991 | Jackson et al. ................ 134/1 |
| 5,068,040 A | 11/1991 | Jackson ..................... 210/748 |
| 5,071,485 A | 12/1991 | Matthews et al. |
| 5,105,556 A | 4/1992 | Kurokawa et al. ............. 34/12 |
| 5,143,103 A | 9/1992 | Basso et al. ................. 134/98.1 |
| 5,158,704 A | 10/1992 | Fulton et al. ................ 252/309 |
| 5,174,917 A | 12/1992 | Monzyk ....................... 252/60 |
| 5,185,058 A | 2/1993 | Cathey, Jr. |
| 5,185,296 A | 2/1993 | Morita et al. ............... 437/229 |
| 5,186,718 A | 2/1993 | Tepman et al. ............. 29/25.01 |
| 5,193,560 A | 3/1993 | Tanaka et al. ............ 134/56 R |
| 5,196,134 A | 3/1993 | Jackson |
| 5,201,960 A | 4/1993 | Starov ......................... 134/11 |
| 5,213,619 A | 5/1993 | Jackson et al. ................ 134/1 |
| 5,215,592 A | 6/1993 | Jackson ......................... 134/1 |
| 5,225,173 A | 7/1993 | Wai ............................. 423/2 |
| 5,236,602 A | 8/1993 | Jackson ..................... 210/748 |
| 5,237,824 A | 8/1993 | Pawliszyn ................... 62/51.1 |
| 5,238,671 A | 8/1993 | Matson et al. ............... 423/397 |
| 5,250,078 A | 10/1993 | Saus et al. ..................... 8/475 |
| 5,261,965 A | 11/1993 | Moslehi ......................... 134/1 |
| 5,266,205 A | 11/1993 | Fulton et al. ............... 210/639 |
| 5,267,455 A | 12/1993 | Dewees et al. ............... 68/5 C |
| 5,269,815 A | 12/1993 | Schlenker et al. ............. 8/475 |
| 5,269,850 A | 12/1993 | Jackson |
| 5,274,129 A | 12/1993 | Natale et al. ................ 549/349 |
| 5,285,352 A | 2/1994 | Pastore et al. |
| 5,288,333 A | 2/1994 | Tanaka et al. ................ 134/31 |
| 5,290,361 A | 3/1994 | Hayashida et al. ............. 134/2 |
| 5,294,261 A | 3/1994 | McDermott et al. ........... 134/7 |
| 5,298,032 A | 3/1994 | Schlenker et al. ............. 8/475 |
| 5,304,515 A | 4/1994 | Morita et al. ............... 437/231 |
| 5,306,350 A | 4/1994 | Hoy et al. ................. 134/22.14 |
| 5,312,882 A | 5/1994 | DeSimone et al. .......... 526/201 |
| 5,313,965 A | 5/1994 | Palen .......................... 134/61 |
| 5,314,574 A | 5/1994 | Takahashi ................... 156/646 |
| 5,316,591 A | 5/1994 | Chao et al. ................... 134/34 |
| 5,320,742 A | 6/1994 | Fletcher et al. |
| 5,328,722 A | 7/1994 | Ghanayem et al. .......... 427/250 |
| 5,334,332 A | 8/1994 | Lee ............................ 252/548 |
| 5,334,493 A | 8/1994 | Fujita et al. ................. 430/463 |
| 5,337,446 A | 8/1994 | Smith et al. ................. 15/21.1 |
| 5,339,844 A | 8/1994 | Stanford, Jr. et al. ....... 134/107 |
| 5,352,327 A | 10/1994 | Witowski ................... 156/646 |
| 5,355,901 A | 10/1994 | Mielnik et al. .............. 134/105 |
| 5,356,538 A | 10/1994 | Wai et al. ................... 210/634 |
| 5,364,497 A | 11/1994 | Chau et al. ................. 156/645 |
| 5,368,171 A | 11/1994 | Jackson ...................... 134/147 |
| 5,370,740 A | 12/1994 | Chao et al. ..................... 134/1 |
| 5,370,741 A | 12/1994 | Bergman |
| 5,370,742 A | 12/1994 | Mitchell et al. .............. 134/10 |
| 5,377,705 A | 1/1995 | Smith, Jr. et al. .......... 134/95.3 |
| 5,401,322 A | 3/1995 | Marshall ..................... 134/13 |
| 5,403,621 A | 4/1995 | Jackson et al. ........... 427/255.1 |
| 5,403,665 A | 4/1995 | Alley et al. ................. 428/447 |
| 5,412,958 A | 5/1995 | Iliff et al. ......................... 68/5 |
| 5,417,768 A | 5/1995 | Smith, Jr. et al. ............. 134/10 |
| 5,456,759 A | 10/1995 | Stanford, Jr. et al. ........... 134/1 |
| 5,470,393 A | 11/1995 | Fukazawa ...................... 134/3 |
| 5,474,812 A | 12/1995 | Truckenmuller et al. 427/430.1 |
| 5,482,564 A | 1/1996 | Douglas et al. ............... 134/18 |
| 5,486,212 A | 1/1996 | Mitchell et al. ............... 8/142 |
| 5,494,526 A | 2/1996 | Paranjpe ....................... 134/1 |
| 5,500,081 A | 3/1996 | Bergman ................. 156/646.1 |
| 5,501,761 A | 3/1996 | Evans et al. ................ 156/344 |
| 5,505,219 A | 4/1996 | Lansberry et al. .......... 134/105 |
| 5,509,431 A | 4/1996 | Smith, Jr. et al. .......... 134/95.1 |
| 5,514,220 A | 5/1996 | Wetmore et al. ......... 134/22.18 |
| 5,522,938 A | 6/1996 | O'Brien ......................... 134/1 |
| 5,526,834 A | 6/1996 | Mielnik et al. ............. 134/105 |
| 5,533,538 A | 7/1996 | Marshall .................. 134/104.4 |
| 5,547,774 A | 8/1996 | Gimzewski et al. . 428/694 ML |
| 5,550,211 A | 8/1996 | DeCrosta et al. ............ 528/480 |
| 5,580,846 A | 12/1996 | Hayashida et al. ......... 510/175 |
| 5,589,082 A | 12/1996 | Lin et al. ....................... 216/2 |
| 5,589,105 A | 12/1996 | DeSimone et al. ......... 252/351 |
| 5,629,918 A | 5/1997 | Ho et al. ..................... 369/112 |
| 5,632,847 A | 5/1997 | Ohno et al. ................. 156/344 |
| 5,635,463 A | 6/1997 | Muraoka ..................... 510/175 |
| 5,637,151 A | 6/1997 | Schulz ........................ 134/2 |
| 5,641,887 A | 6/1997 | Beckman et al. .......... 546/26.2 |
| 5,656,097 A | 8/1997 | Olesen et al. .................. 134/1 |
| 5,665,527 A | 9/1997 | Allen et al. ................. 430/325 |
| 5,669,251 A | 9/1997 | Townsend et al. ............. 68/58 |
| 5,676,705 A | 10/1997 | Jureller et al. ................. 8/142 |
| 5,679,169 A | 10/1997 | Gonzales et al. ............ 134/1.3 |
| 5,679,171 A | 10/1997 | Saga et al. ...................... 134/3 |
| 5,683,473 A | 11/1997 | Jureller et al. ................. 8/142 |
| 5,683,977 A | 11/1997 | Jureller et al. .............. 510/286 |
| 5,688,879 A | 11/1997 | DeSimone ................... 526/89 |
| 5,700,379 A | 12/1997 | Biebl ............................ 216/2 |
| 5,714,299 A | 2/1998 | Combes et al. |
| 5,725,987 A | 3/1998 | Combes et al. |
| 5,726,211 A | 3/1998 | Hedrick et al. ............... 521/61 |
| 5,730,874 A | 3/1998 | Wai et al. ................... 210/638 |
| 5,736,425 A | 4/1998 | Smith et al. |
| 5,739,223 A | 4/1998 | DeSimone ................... 526/89 |
| 5,766,367 A | 6/1998 | Smith et al. |
| 5,783,082 A | 7/1998 | DeSimone et al. .......... 210/634 |
| 5,797,719 A | 8/1998 | James et al. .................. 417/46 |
| 5,798,438 A | 8/1998 | Sawan et al. ................ 528/483 |
| 5,804,607 A | 9/1998 | Hedrick et al. ............... 521/64 |
| 5,807,607 A | 9/1998 | Smith et al. |
| 5,847,443 A | 12/1998 | Cho et al. |
| 5,866,005 A | 2/1999 | DeSimone et al. ......... 210/634 |
| 5,868,856 A | 2/1999 | Douglas et al. ................ 134/2 |
| 5,868,862 A | 2/1999 | Douglas et al. ............... 134/26 |
| 5,872,061 A | 2/1999 | Lee et al. |
| 5,872,257 A | 2/1999 | Beckman et al. ........... 546/336 |
| 5,873,948 A | 2/1999 | Kim ............................ 134/19 |
| 5,881,577 A | 3/1999 | Sauer et al. ..................... 68/5 |
| 5,882,165 A | 3/1999 | Maydan et al. ............. 414/217 |
| 5,888,050 A | 3/1999 | Fitzgerald et al. ............ 417/46 |
| 5,893,756 A | 4/1999 | Berman et al. |
| 5,896,870 A | 4/1999 | Huynh et al. |

| | | | | | | |
|---|---|---|---|---|---|---|
| 5,900,354 A | 5/1999 | Batchelder ............... 430/395 | | 2001/0041458 A1 | 11/2001 | Ikakura et al. |
| 5,904,737 A | 5/1999 | Preston et al. | | 2002/0001929 A1 | 1/2002 | Biberger et al. |
| 5,908,510 A | 6/1999 | McCullough et al. ......... 134/2 | | 2002/0055323 A1 | 5/2002 | McClain et al. |
| 5,928,389 A | 7/1999 | Jevtic ...................... 29/25.01 | | 2002/0074289 A1 | 6/2002 | Sateria et al. |
| 5,932,100 A | 8/1999 | Yager et al. ............... 210/634 | | 2002/0081533 A1 | 6/2002 | Simons et al. |
| 5,944,996 A | 8/1999 | DeSimone et al. ......... 210/634 | | 2002/0088477 A1 | 7/2002 | Cotle et al. |
| 5,955,140 A | 9/1999 | Smith et al. ............... 427/96 | | 2002/0098680 A1 | 7/2002 | Goldstein et al. |
| 5,965,025 A | 10/1999 | Wai et al. ................ 210/634 | | 2002/0106867 A1 | 8/2002 | Yang et al. |
| 5,976,264 A | 11/1999 | McCullough et al. ......... 134/2 | | 2002/0112740 A1 | 8/2002 | DeYoung et al. |
| 5,979,306 A | 11/1999 | Fujikawa et al. ........... 100/90 | | 2002/0112746 A1 | 8/2002 | DeYoung et al. |
| 5,980,648 A | 11/1999 | Adler ........................ 134/34 | | 2002/0115022 A1 | 8/2002 | Messick et al. |
| 5,992,680 A | 11/1999 | Smith | | 2002/0117391 A1 | 8/2002 | Beam |
| 5,994,696 A | 11/1999 | Tai et al. | | 2002/0123229 A1 | 9/2002 | Ono et al. |
| 6,005,226 A | 12/1999 | Aschner et al. | | 2002/0127844 A1 | 9/2002 | Grill et al. |
| 6,017,820 A | 1/2000 | Ting et al. ................. 438/689 | | 2002/0132192 A1 | 9/2002 | Namatsu |
| 6,024,801 A * | 2/2000 | Wallace et al. ................ 134/1 | | 2002/0141925 A1 | 10/2002 | Wong et al. |
| 6,037,277 A | 3/2000 | Masakara et al. | | 2002/0142595 A1 | 10/2002 | Chiou |
| 6,063,714 A | 5/2000 | Smith et al. | | 2002/0150522 A1 | 10/2002 | Heim et al. |
| 6,067,728 A | 5/2000 | Farmer et al. ................ 34/470 | | 2002/0170671 A1 * | 11/2002 | Matsushita et al. ..... 156/345.31 |
| 6,099,619 A | 8/2000 | Lansbarkis et al. | | 2003/0003762 A1 | 1/2003 | Cotte et al. |
| 6,100,198 A | 8/2000 | Grieger et al. | | 2003/0008238 A1 | 1/2003 | Goldfarb et al. |
| 6,110,232 A | 8/2000 | Chen et al. ................ 29/25.01 | | 2003/0008518 A1 | 1/2003 | Chang et al. |
| 6,114,044 A | 9/2000 | Houston et al. ............ 428/447 | | 2003/0013311 A1 | 1/2003 | Chang et al. |
| 6,128,830 A | 10/2000 | Bettcher et al. | | 2003/0036023 A1 | 2/2003 | Moreau et al. |
| 6,140,252 A | 10/2000 | Cho et al. | | 2003/0047533 A1 | 3/2003 | Reid et al. |
| 6,149,828 A * | 11/2000 | Vaarstra ........................ 216/57 | | 2003/0051741 A1 * | 3/2003 | DeSimone et al. ............ 134/21 |
| 6,171,645 B1 | 1/2001 | Smith et al. | | 2003/0172954 A1 * | 9/2003 | Verhaverbeke ............... 134/1.3 |
| 6,186,722 B1 | 2/2001 | Shirai ........................ 414/217 | | | | |
| 6,200,943 B1 | 3/2001 | Romack et al. | | FOREIGN PATENT DOCUMENTS | | |
| 6,216,364 B1 | 4/2001 | Tanaka et al. | | | | |
| 6,224,774 B1 | 5/2001 | DeSimone et al. | | DE | 39 06 735 C2 | 9/1990 ............. D06L/3/00 |
| 6,228,563 B1 * | 5/2001 | Starov et al. ............... 430/327 | | DE | 39 06 737 A1 | 9/1990 .......... D06M/11/59 |
| 6,228,826 B1 | 5/2001 | DeYoung et al. | | DE | 44 29 470 A1 | 3/1995 ............. D06P/5/04 |
| 6,232,238 B1 | 5/2001 | Chang et al. | | DE | 43 44 021 A1 | 6/1995 ............. D06P/1/16 |
| 6,232,417 B1 | 5/2001 | Rhodes et al. | | DE | 198 60 084 A1 | 7/2000 ........ H01L/32/3213 |
| 6,235,634 B1 | 5/2001 | White et al. ............... 438/680 | | EP | 0 283 740 A2 | 9/1988 ............. C22B/3/00 |
| 6,239,038 B1 | 5/2001 | Wen | | EP | 0 302 345 A2 | 2/1989 ............. C22B/3/00 |
| 6,242,165 B1 * | 6/2001 | Vaarstra ...................... 430/329 | | EP | 0 370 233 A1 | 5/1990 ............. C22B/3/00 |
| 6,244,121 B1 | 6/2001 | Hunter ...................... 73/865.9 | | EP | 0 391 035 | 10/1990 ............. C23G/5/00 |
| 6,251,250 B1 | 6/2001 | Keigler | | EP | 0 518 653 B1 | 12/1992 ............. D06L/1/02 |
| 6,255,732 B1 | 7/2001 | Yokoyama et al. | | EP | 0 518 658 B1 | 12/1992 ............. D06L/1/02 |
| 6,270,531 B1 | 8/2001 | DeYoung et al. | | EP | 0 536 752 A2 | 4/1993 ............. C11D/3/20 |
| 6,270,948 B1 | 8/2001 | Sato et al. | | EP | 0 572 913 A1 | 12/1993 ........... B01D/11/02 |
| 6,277,753 B1 | 8/2001 | Mullee et al. | | EP | 0 587 168 A1 | 3/1994 ............. B08B/7/00 |
| 6,284,558 B1 | 9/2001 | Sakamoto | | EP | 0 620 270 A3 | 10/1994 ............. C11D/7/50 |
| 6,286,231 B1 | 9/2001 | Bergman et al. | | EP | 0 679 753 B1 | 11/1995 ............. D06F/43/00 |
| 6,306,564 B1 | 10/2001 | Mullee | | EP | 0 711 864 B1 | 5/1996 ............. D06G/1/00 |
| 6,319,858 B1 * | 11/2001 | Lee et al. ................... 438/787 | | EP | 0 726 099 A2 | 8/1996 ............. B08B/5/00 |
| 6,331,487 B2 | 12/2001 | Koch | | EP | 0 822 583 A2 | 2/1998 ......... H01L/21/306 |
| 6,344,243 B1 | 2/2002 | McClain et al. | | EP | 0 829 312 A2 | 3/1998 ............. B08B/3/08 |
| 6,358,673 B1 | 3/2002 | Namatsu | | EP | 0 836 895 A2 | 4/1998 ............. B08B/7/00 |
| 6,361,696 B1 | 3/2002 | Spiegelman et al. | | JP | 60-1922333 | 9/1985 ............. H01L/21/30 |
| 6,367,491 B1 | 4/2002 | Marshall et al. | | JP | 62-125619 | 6/1987 ............. H01L/21/30 |
| 6,380,105 B1 | 4/2002 | Smith et al. | | JP | 1045131 | 2/1989 ......... B01D/011/04 |
| 6,425,956 B1 | 7/2002 | Cotte et al. | | JP | 1-246835 | 10/1989 ......... H01L/21/304 |
| 6,436,824 B1 | 8/2002 | Chooi et al. | | JP | 2-148841 | 6/1990 ......... H01L/21/306 |
| 6,454,945 B1 | 9/2002 | Weigl et al. | | JP | 2-209729 | 8/1990 ......... H01L/21/302 |
| 6,458,494 B2 | 10/2002 | Song et al. | | JP | 2-3049141 | 12/1990 ........... H01L/21/56 |
| 6,461,967 B2 | 10/2002 | Wu et al. | | JP | 7142333 | 6/1995 ....... H01L/021/027 |
| 6,485,895 B1 | 11/2002 | Choi et al. | | JP | 727711 | 2/1996 ....... H01L/021/027 |
| 6,486,078 B1 | 11/2002 | Rangarajan et al. | | JP | 8-186140 | 7/1996 ........... H01L/21/56 |
| 6,492,090 B2 | 12/2002 | Nishi et al. | | JP | 8222508 | 8/1996 ....... H01L/021/027 |
| 6,500,605 B1 | 12/2002 | Mullee et al. | | JP | 2000-106358 | 4/2000 ......... H01L/21/3065 |
| 6,508,259 B1 * | 1/2003 | Tseronis et al. ............. 134/105 | | WO | WO 90-06189 | 6/1990 ............. B08B/7/00 |
| 6,558,475 B1 | 5/2003 | Jur et al. | | WO | WO 90/06189 | 6/1990 ............. B08B/7/00 |
| 6,562,146 B1 | 5/2003 | DeYoung et al. | | WO | WO 90/13675 | 11/1990 ............. C22B/3/00 |
| 6,592,938 B1 * | 7/2003 | Pessey et al. ................ 427/212 | | WO | WO 93/14255 | 7/1993 ............. D06B/5/16 |
| 2001/0019857 A1 | 9/2001 | Yokoyama et al. | | WO | WO 93/14259 | 7/1993 .......... D06M/11/76 |
| 2001/0024247 A1 | 9/2001 | Nakata | | WO | WO 93/20116 | 10/1993 ........... C08F/14/18 |
| 2001/0029971 A1 * | 10/2001 | Farmer et al. ............... 134/56 | | WO | WO 96/27704 | 9/1996 ............. D06L/1/00 |
| 2001/0041455 A1 | 11/2001 | Yun et al. | | WO | WO 99/49998 | 10/1999 ............. B08B/5/00 |

| | | | | |
|---|---|---|---|---|
| WO | WO 00/73241 A1 | 12/2000 | | C04B/35/622 |
| WO | WO 01/10733 A1 | 2/2001 | | B65D/55/00 |
| WO | WO 01/33615 A3 | 2/2001 | | H01L/21/00 |
| WO | WO 02/09894 A2 | 2/2002 | | |
| WO | WO 02/11191 A2 | 2/2002 | | H01L/21/00 |
| WO | WO 02/16051 A2 | 2/2002 | | |

OTHER PUBLICATIONS

"Los Almos National Laboratory," Solid State Technology, pp. S10 & 14, Oct. 1998.

"Supercritical Carbon Dioxide Resist Remover, SCORR, the Path to Least Photoresistance," Los Almos National Laboratory, 1998.

Guan, Z. et al., "Fluorocarbon–Based Heterophase Polymeric Materials. 1. Block Copolymer Surfactants for Carbon Dioxide Applications," macromolecules, vol. 27, 1994, pp 5527–5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp 1585–1591.

Kirk–Othmer, "Alcohol Fuels to Toxicology, " Encyclopedia of Chemical Terminology, 3rd ed., Supplement vol., 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alomos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al. "Preparation of Polymer–Protected Semiconductor Nanoparticles Through the Rapid Epansion of Supercritical Fluid Solution," Chemical Physics Letters, pp. 585–588, May 22, 1998.

Jackson, K. et al., "Surfactants and Micromulsions in Supercritical Fluids," Supercritical Fluid Cleaning. Noyes Publications, Westwood, NJ, pp. 87–120, Spring 1998.

Kryszewski, M., "Production of Metal and Semiconductor Nanoparticles in Polymer Systems," Polymery, pp. 65–73, Feb. 1998.

Bakker, G.L. et al., "Surface Cleaning and Carbonaceous Film Removal Using High Pressure, High Temperature Water, and Water/CO2 Mixtures," J. Electrochem. Soc, vol. 145, No. 1, pp. 284–291, Jan. 98.

Ober, C.K. et al., "Imaging Polymers with Supercritical Carbon Dioxide," Advanced Materials, vol. 9, No. 13, 1039–1043, Nov. 3, 1997.

Russick, E.M. et al., "Supercritical Carbon Dioxide Extraction of Solvent from Micromachined Structures." Supercritical Fluids Extraction and Pollution Prevention, ACS Symposium Series, vol. 670, pp. 255–269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Wai, C.M., "Supercritical Fluid Extraction: Metals as Complexes," Journal of Chromatograhy A, vol. 785,pp. 369–383, Oct. 17, 1997.

Xu, C. et al., "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Tomioka Y, et al., "Decomposition of Tetramethylammonium (TMA) in a Positive Photoresist Developer by Supercritical Water," Abstracts of Papers $214^{th}$ ACS Natl Meeting, American Chemical Society, Abstract no. 108, Sep. 7, 1997.

Klein, H. et al., "Cyclic Organic Carbonates Serve as Solvents and Reactive Diluents," Coatings World, pp. 38–40, May 1997.

Bühler, J. et al., Liner Array of Complementary Metal Oxide Semiconductor Double–Pass Metal Micromirrors, Opt. Eng., vol. 36, No. 5, pp 1391–1398, May 1997.

Jo, M.H. et al., Evaluation of S102 Aerogel Thin Film with Ultra Low Dielectric Constant as an Intermetal Dielectric, Microelectronic Engineering, vol. 33, pp. 343–348, Jan. 1997.

McClain, J.B. et al., "Design of Nonionic Surfactants for Supercritical Carbon Dioxide," Science, vol. 27, Dec. 20, 1996. pp. 2049–2052.

Znaidi, L. et al., "Batch and Semi–Continous Synthesis of Magnesium Oxide Powders from Hydrolysis and Supercritical Treatment of Mg(OCH3)2," Materials Research Bulletin, vol. 31, No. 12, pp. 1527–1335, Dec. 1996.

Tadros, M.E., "Synthesis of Titanium Dioxide Particles in Supercritical CO2," J. Supercritical Fluids, vol. 9, pp. 172–176, Sep.1996.

Courtecuisse, V.G. et al., Kinetics of the Titanium Isopropoxide Decomposition in Supercritical Isopropyl Alcohol, Ind. Eng. Chem. Res., vol. 35, No. 8, pp. 2539–2545, Aug. 1996.

Gabor, A, et al., "Block and Random Copolymer resists Designed for 193 nm Lithography and Enviromentally Friendly Supercritical CO2 Development," Dept. Mat. Sci. & Eng. Cornell Univ., SPIE, vol. 2724, pp. 410–417, Jun. 1995.

Schimek, G. L. et al., "Supercritical Ammonium Synthesis and Charaterization of Four New Alkali Metal Silver Antimony Sulfides...," J. Solid State Chemistry, vol. 123 pp. 277–284, May 1996.

Gallagher–Wetmore, P. et al, "Supercritical Fluid Processing: Opportunities for New Resist Materials and Processes," IBM Research Division, SPIE, vol. 2725, pp. 289–299, Apr. 1996.

Papathomas, K.J. et al., "Debonding of Photoresists by Organic Solvents," J. Applied Polymer Science, vol. 59, pp. 2029–2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991–1994.

Gloyna, E.F. et al., "Supercritical Water Oxidation Research and Development Update," Environment Progess, vol. 14, No. 3. pp. 182–192, Aug. 1995.

Gloyra, E.F. et al., "Supercritical Water Oxidation Research and Development Update," Environment Progess, vol. 14, No. 3. pp. 182–192, Aug. 1995.

Gallagher–Wetmore, P. et al., "Supercritical Fluid Processing: A New Dry Technique for Photoresist Developing," IBM Research Division, SPIE vol. 2438, pp. 694–708, Jun. 1995.

Gabor, A. H. et al., "Silicon–Containing Block Copolymer Resist Materials," Microelectronics Technology—Polymers for Advanced Imaging and Packaging, ACS Symposium Series, vol. 614, pp. 281–298, Apr. 1995.

Tsiartas, P.C. et al., "Effect of Molecular weight Distribution on the Dissolution Properties of Novolac Blends," SPIE, vol. 2438, pp. 264–271, 1995.

Allen, R.D. et al., "Performance Properties of Near–Monodisperse Novolak Resins,"SPIE, vol. 2438, pp. 250–260, 1995.

Wood, P.T. et al., "Synthesis of New Channeled Structures in Supercritical Amines...," Inorg. Chem., vol. 33, pp. 1556–1558, 1994.

Jerome, J.E. et al., "Synthesis of New Low–Dimensional Quaternary Compounds...," Inorg. Chem, vol. 33, pp. 1733–1734, 1994.

McHardy, J. et al., "Progress in Supercritical $CO_2$ Cleaning," SAMPE Jour., vol. 29, No. 5, pp. 20–27, Sep. 1993.

Purtell, R, et al., Precision Parts Cleaning using Supercritical Fluids, J. Vac, Sci, Technol. A. vol. 11, No. 4, Jul. 1993, pp. 1696–1701.

Bok, E, et al., "Supercritical Fluids for Single Wafer Cleaning,"Solids State Technology, pp. 117–120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019–1022, 1992.

Hansen, B.N. et al., "Supercritical Fluid Transport—Chemical Deposition of Films,"Chem. Mater., vol. 4, No. 4, pp, 749–752, 1992.

Page, S.H. et al., "Predictability and Effect of Phase Behavior of $CO_2$/Propylene Carbonate in Supercritical Fluid Chromatography," J. Microl. Sep. vol 3, No. 4, pp. 355–369.

Brokamp, T. et al., "Synthese und Kristallstruktur Eines Gemischtvalenten Lithium–Tanalnitrids $Li_2Ta_3Ns$," J. Alloys and Compounds, vol 176. pp. 47–60, 1991.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RIE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol.26, No. 11, pp. 2298–2306, 1987.

Tolley, W.K. et al., "Stripping Organics from Metal and Mineral Surfaces using Supercritical Fluids," Separation Science and Technology, vol. 2+3, pp. 1087–1101, 1987.

"Final Report on the Safety Assessment of Propylene Carbonate," J. American College of Toxicology, vol. 6, No. 1, pp.23–51, 1987.

"Porous Xerogel Films as Ultra–Low Permittivity Dielectrics for ULSI Interconnect Applications", Materials Research Society, pp. 463–469, 1997.

Kawakami et al, "A Super Low–k (k=1.1) Silica Aerogel Film Using Supercritical Drying Technique", IEEE, pp. 143–145, 2000.

R.F. Reidy, "Effects of Supercritical Processing on Ultra Low–K Films", Texas Advanced Technology Program, Texas Instruments, and the Texas Academy of Mathematics and Science.

Anthony Muscat, "Backend Processing Using Supercritical $CO2$", University of Arizona.

D. Goldfarb et al., "Aqueous–based Photoresist Drying Using Supercritical Carbon Dioxide to Prevent Pattern Collapse", J. Vacuum Sci. Tech. B 18(6), 3313 (2000).

H. Namatsu et al., "Supercritical Drying for Water–Rinsed Resist Systems", J. Vacuum Sci. Tech. B 18 (6), 3308 (2000).

N. Sundararajan et al., "Supercritical $CO2$ Processing for Submicron Imaging of Fluoropolymers", Chem. Mater. 12, 41 (2000).

* cited by examiner

METHOD OF DEPOSITING METAL FILM AND METAL DEPOSITION CLUSTER TOOL INCLUDING SUPERCRITICAL DRYING/CLEANING MODULE

RELATED APPLICATIONS

This application claims priority from U.S. Provisional Patent Application No. 60/199,580 filed on Apr. 25, 2000, which is incorporated by reference.

FIELD OF THE INVENTION

This invention relates to the field of deposition of film. More particularly, this invention relates to the field of deposition of films onto a substrate where a prior processing step includes desorbing or precleaning of the substrate.

BACKGROUND OF THE INVENTION

Deposition of a metal film in semiconductor processing often requires desorb and preclean steps prior to the deposition of the metal film. The desorb and preclean steps assure good adhesion of the metal film to a substrate and also provides better contact resistance between a substrate metal and the metal film.

In the prior art, the desorb step, the preclean step, and the deposition of the metal film take place within a cluster tool so that the substrate is not exposed to atmosphere between the desorb or preclean steps and the deposition of the metal film.

The desorb step of the prior art heats the substrate under vacuum in order to degas the substrate. By heating the substrate under vacuum, material adsorbed to the surface of the substrate or absorbed within the substrate are removed from the substrate. Typical process conditions include vacuum of $10^{-3}$ Torr or higher vacuum, and temperature within the range of 200 and 400° C. Generally, higher temperatures are employed in order to minimize process times, which for the higher temperatures are generally within the range of 30 and 60 s.

The preclean step of the prior art exposes the substrate to ion bombardment in what is often referred to as a sputter-etch preclean. In the sputter-etch preclean, argon ions, hydrogen ions, helium ions, or some combination thereof, and electrons form a plasma, which bombards a surface of the substrate to sputter away a thin layer of material. Typically, in the semiconductor processing, an etching step precedes the deposition of the metal film. The etching step forms trenches and via holes in the substrate to an underlying metal layer. After the etching step, an oxide forms on an exposed surface of the underlying metal layer at the via holes due to exposure of the substrate to atmosphere. The sputter-etch preclean attempts to etch away the oxide and any remaining residue after ashing and wet cleaning. The sputter-etch preclean typically requires a vacuum of $10^{-3}$ Torr or higher vacuum.

A particular metal deposition process of the prior art deposits a barrier metal layer and a copper seed layer onto a semiconductor substrate forming contacts with an underlying copper layer at the via holes. In the etching step, the via holes are formed through silicon dioxide and silicon nitride layers to the underlying copper layer. In another etching step of the prior art, the via holes are formed in low-k dielectric materials such as a polymer-based materials and fluorine or carbon containing oxides. After the etching step and before the deposition of the metal film, a plasma ashing step and a wet cleaning step substantially remove photoresist, photoresist residue, and etch residue leaving material adsorbed to the surface of the substrate and leaving a thin copper oxide layer on the underlying copper layer at the via holes. The desorb step of the prior art removes the material adsorbed to the surface of the substrate. The sputter-etch preclean removes the copper oxide layer within the via holes and removes an exposed layer of the substrate surrounding the via holes. The barrier metal is then deposited followed by the copper seed layer. Subsequently, an electroplating step deposits an additional copper layer on the copper seed layer.

The cluster tool of the prior art includes a handoff station, a front transfer module, a back transfer module, a degas module, a sputter-etch module, and a metal deposition module. The front transfer module includes a first robot. The back transfer module includes a second robot. The handoff station is coupled to the front transfer module by a first valve or loadlock. The degas module and the sputter-etch module are coupled to the front transfer module. The back transfer module is coupled to the front transfer module by a second valve or loadlock. The metal deposition module is coupled to the back transfer module. Often, the cluster tool includes two degas modules, two sputter-etch modules, and two or more metal deposition modules. In operation, the front and back transfer modules operate at vacuum. A second cluster tool for performing the desorb, preclean and metal deposition of the prior art includes a single transfer module, the degas module, the sputter-etch module, and the metal deposition module, where the degas module, the sputter-etch module, and the metal deposition module are coupled to the single transfer module.

Operation of the cluster tool begins with the first robot transferring a substrate from the handoff station to the degas module, where the desorb step takes place. The first robot then transfers the substrate to the sputter-etch module where the sputter-etch preclean takes place. The first robot then transfers the substrate to the second robot, which places the substrate in the metal deposition module. After the deposition of the metal film, the second robot then returns the substrate to the first robot, which returns the substrate to the handoff station.

Because the desorb step of the prior art operates at elevated temperatures, there is potential for temperature induced damage of the substrate. This concern is especially apt for polymer materials because future integrated circuits may employ the polymer materials as insulators due to their low dielectric constant properties.

In the preclean step, the plasma can cause plasma damage of the surface of the substrate. Also, it is well known that the sputter-etch preclean causes corner clipping at edges of the trenches and at edges of the via holes creating facets. The corner clipping is especially detrimental to smaller dimension integrated circuits since the corner clipping reduces separation of adjacent lines leading to unacceptable electrical interference between the adjacent lines. Not only does the sputter-etch preclean cause physical damage of integrated circuits, it could also causes electrical damage.

Further, sputtering of the underlying metal layer in the trenches and the via holes can cause barreling as well as causing deposition of sputtered material on sidewalls of the trenches and the via holes. For example, sputter-etch preclean of the copper oxide layer within the via holes causes copper and copper oxide to deposit on the sidewalls of the via holes. Moreover, the sputter-etch preclean is inappropriate for precleaning polymer based materials due to expected damage caused by the physical bombardment in the sputter-etch preclean. Also, even if the sputter-etch preclean can be used, the hydrogen ions cannot be used when the polymer materials are exposed since the hydrogen will hydrate the polymer-based materials. Additionally, the sputter-etch preclean becomes less effective as an aspect ratio (depth divided by width) of the trenches and of the via holes increases.

Both the degas module and the sputter-etch module require high vacuum pumps and associated vacuum plumbing, which increases purchase and maintenance costs of the cluster tool. The sputter-etch module further increases the purchase and maintenance costs of the cluster tool because it relatively complex and requires frequent maintenance to ensure that it does not become a source of particulate contamination.

What is needed is a desorb method compatible with metal deposition that does not require excessive temperatures.

What is needed is a preclean method compatible with metal deposition that does not use a plasma.

What is needed is a desorb method compatible with low-k materials such as polymer materials, and fluorine or carbon containing oxides.

What is needed is a preclean method compatible with low-k materials such as polymer materials, and fluorine or carbon containing oxides.

What is needed is a desorb method compatible with metal deposition which is less expensive.

What is needed is a preclean method compatible with metal deposition which is less expensive.

SUMMARY OF THE INVENTION

A method of depositing a metal film on a substrate includes a supercritical preclean step, a supercritical desorb step, and a metal deposition step. Preferably, the preclean step comprises maintaining supercritical carbon dioxide and a chelating agent in contact with the substrate in order to remove an oxide layer from a metal surface of the substrate. More preferably, the preclean step comprises maintaining the supercritical carbon dioxide, the chelating agent, and an acid in contact with the substrate where the acid dissolves the oxide layer while the chelating agent attaches to loose metal ions and carries away the loose metal ions. Alternatively, the preclean step comprises maintaining the supercritical carbon dioxide and an amine in contact with the oxide layer where the amine dissolves the oxide layer and carries away metal ions. The desorb step comprises maintaining supercritical carbon dioxide in contact with the substrate in order to remove adsorbed material from the substrate. The metal deposition step then deposits the metal film on the substrate without exposing the substrate to an oxidizing material which oxidizes the metal surface of the precleaned substrate and without exposing the substrate to a nonvolatile adsorbing material which adsorbs to the substrate.

An apparatus for depositing the metal film on a substrate includes a transfer module, a supercritical processing module, a vacuum module, and a metal deposition module. The supercritical processing module is coupled to the transfer module. The vacuum module couples the metal deposition module to the transfer module. In operation, the apparatus for depositing the metal film performs the supercritical preclean step, the supercritical desorb step, and the metal deposition step.

DETAILED DESCRIPTION OF THE PREFERRED EMBODIMENT

Figure 1:
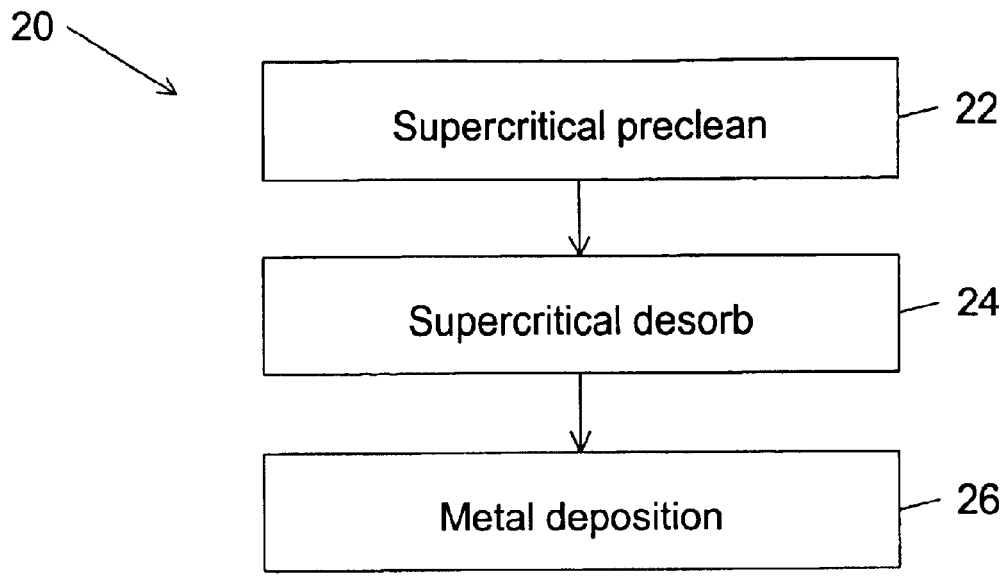
FIG. 1 schematically illustrates the preferred method of the present invention.

The preferred method of the present invention is schematically illustrated in FIG. 1. The preferred method 20 deposits a metal film on a substrate. Preferably, the substrate is a semiconductor substrate having via holes through a dielectric material to an underlying metal layer. When the metal film is deposited on the semiconductor substrate, the metal film contacts the underlying metal layer at the via holes. More preferably, the semiconductor substrate includes via holes and trenches in a dual damascene structure. In the dual damascene structure, the metal layer also contacts the underlying metal layer at the via holes. Alternatively, the metal film is deposited on an alternative substrate where the metal film contacts an exposed metal surface on the alternative substrate.

The preferred method 20 comprises a supercritical preclean step 22, a supercritical desorb step 24, and a metal deposition step 26. In the supercritical preclean step 22, the substrate is maintained in a supercritical chamber and is preferably exposed to supercritical carbon dioxide and a chelating agent. The chelating agent in conjunction with the supercritical carbon dioxide reacts with an oxide on the underlying metal layer to form chelates of the underlying metal. The supercritical carbon dioxide carries away the chelates. In the supercritical desorb step 24, the substrate is maintained within the supercritical chamber and exposed to supercritical carbon dioxide, which desorbs adsorbed materials or absorbed materials from the substrate.

More preferably, the supercritical preclean step 22 comprises maintaining an acid as well as the supercritical carbon dioxide and the chelating agent in contact with the substrate. The acid acts to dissolve the oxide while the chelating agent attaches to loose metal ions and carries away the loose metal ions.

Preferably, the chelating agent is selected from the group comprising 2,4-pentanedione, 1,1,1,6,6,6-hexafluoro-2,4-pentanedione, 1,1,1-trifluoropentane-2,4-dione, 2,6-dimethylheptane-3,5-dione, 2,2,7-trimethyloctane-2,4-dione, 2,2,6,6-tetramethylheptane-3,5-dione, ethylenediamine diacetic acid (EDTA), and nitrilotriacetic acid (NTA).

Preferably, the acid is selected from the group comprising an organic acid or an inorganic acid depending upon the particular oxide that is being precleaned. Preferably, the organic acid is used for a preclean of copper oxide. More preferably, for the preclean of copper oxide, the organic acid is selected from the group comprising acetic acid, formic acid, oxalic acid and malonic acid; alpha hydroxy acids such as glycolic acid, citric acid, malic acid or lactic acid; or amino acids such as glycine, alanine, leucine, valine, glutamine or lysine.

Preferably, the inorganic acid is used for a preclean of aluminum oxide. More preferably, for the preclean of aluminum oxide, the inorganic acid is selected from the group comprising hydrofluoric acid and buffered hydrofluoric acid formulations such as ammonium fluoride and ammonium bifluoride.

Alternatively, in the preclean step 22, the chelating agent and the acid are replaced by an amine. The amine acts to dissolve the oxide and to carry away metal ions. Preferably, the amine is selected from the group comprising triethanolamine, 2-methylaminoethanol, pyridine, 2,2'-bipyridine, and pentamethyldiethylenetriamine.

In the supercritical preclean step 22, the supercritical chamber is preferably pressurized to an elevated pressure exceeding the critical pressure and the supercritical carbon dioxide and the chelating agent are flowed over the substrate. More preferably, the supercritical carbon dioxide, the chelating agent, and the acid are flowed over the substrate. Alternatively, the supercritical carbon dioxide and the amine are flowed over the substrate.

In order to achieve supercritical conditions within the supercritical chamber, temperature within the chamber must be maintained at or above a critical temperature, which is 30.5° C. Following this, the pressure is cycled at least one and a half times between the elevated pressure and a lower pressure. Preferably, the lower pressure is above the critical pressure.

The supercritical desorb step 24 is preferably part of the supercritical preclean step 22. Gases and liquids adsorbed to the substrate or absorbed within the substrate will desorb during the supercritical preclean step 22. Elevating the temperature within the chamber is anticipated to improve the supercritical desorb step 24. Alternatively, the supercritical desorb step 24 is performed as a separate step, either before or after the supercritical preclean step 22.

Preferably, during the supercritical preclean and desorb steps, 22 and 24, the temperature within the chamber is within the range of 31 and 100° C. Alternatively, the temperature within the chamber is maintained below a temperature limit of the substrate.

The metal deposition step 26 comprises depositing the metal film on the substrate. Preferably, the substrate includes the via holes to the underlying metal layer. The metal deposition step 26 preferably deposits the metal film within the via holes so that the metal film contacts the underlying metal layer. Preferably, the metal deposition step 26 is a chemical vapor deposition (CVD) process. Alternatively, the metal deposition step 26 is a physical vapor deposition (PVD) process.

It is important that between the supercritical preclean, supercritical desorb, and metal deposition steps, 22, 24, and 26, the substrate is not exposed to atmosphere or other gases which will form a nonvolatile adsorbate on the substrate, which will not form a nonvolatile absorbate within the substrate, or which will react with the substrate. Forming a volatile adsorbate on the substrate is not detrimental because a brief exposure to vacuum at an end of the supercritical preclean step 22 or at the end of the supercritical desorb step 24 will cause the volatile adsorbate to quickly desorb from the substrate. Similarly, forming a volatile absorbate is not detrimental because the brief exposure to vacuum will cause the volatile absorbate to quickly desorb from the substrate. Preferably, the substrate is maintained in vacuum between the supercritical preclean, supercritical desorb, and metal deposition steps, 22, 24, and 26. Alternatively, the substrate is maintained in an inert gas environment between the supercritical preclean, supercritical desorb, and metal deposition steps, 22, 24, and 26, where the inert gas environment does not form the nonvolatile adsorbate nor the nonvolatile absorbate.

By using the supercritical preclean step 22 rather than a sputter-etch preclean step, plasma damage of the substrate is avoided. Further, using the supercritical preclean step 22 rather than the sputter-etch preclean step avoids corner clipping and facet creation at edges of trenches and of via holes, avoids barreling of the trenches and of the via holes, and avoids deposition of sputtered material onto sidewalls of the trenches and of the via holes. Additionally, using the supercritical preclean step 22 rather than the sputter-etch preclean step avoids electrical damage of an integrated circuit that is fabricated on the substrate. Moreover, the supercritical preclean step 22 will cause less damage to polymer based dielectric materials than the sputter-etch preclean step.

Using the supercritical desorb step 24 rather than heating the substrate under vacuum to degas the substrate avoids use of excessive temperature in processing the substrate, which is especially important for the polymer based dielectric materials.

Depending on specific process requirements, either the supercritical preclean step 22 or the supercritical desorb step 24 may be unneeded. In a first alternative method of the present invention, the supercritical preclean step 22 and the metal deposition step 26 are performed but the supercritical desorb step 24 is not performed. In a second alternative method of the present invention the supercritical desorb step 24 and the metal deposition step 26 are performed but the supercritical preclean step 22 is not performed. In a third alternative method of the present invention, the metal deposition step 26 of the second alternative method is replaced by an alternative deposition step. In the alternative deposition step, a film other than the metal film is deposited on the substrate.

Figure 2:
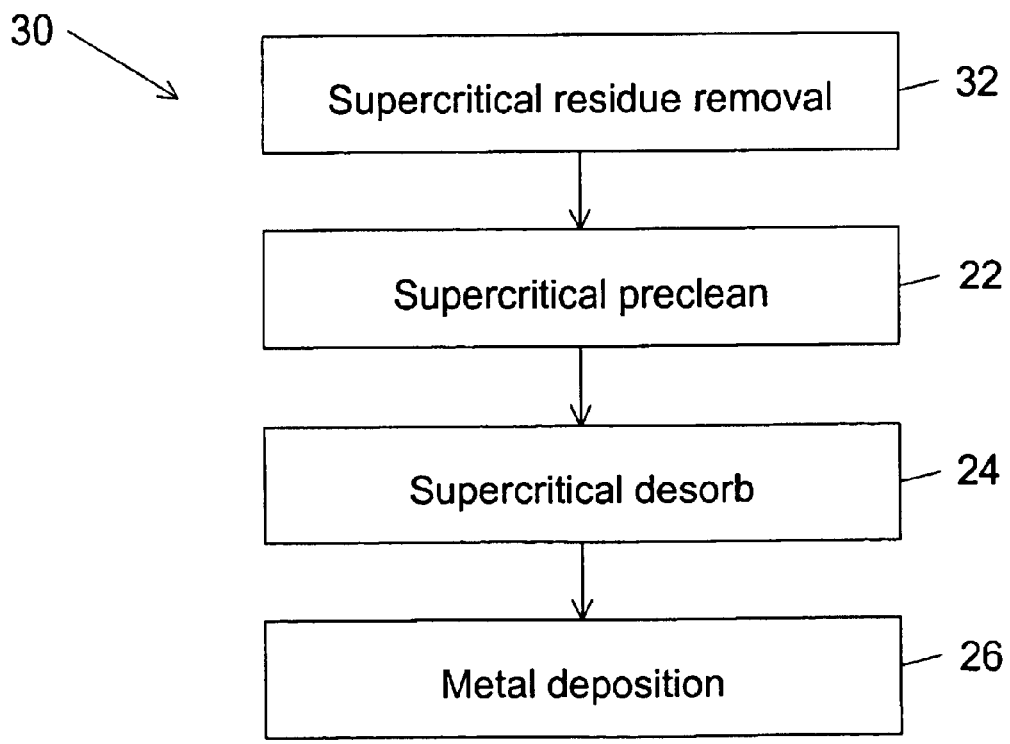
FIG. 2 schematically illustrates an alternative method of the present invention.

A fourth alternative method of the present invention is schematically illustrated in FIG. 2. The fourth alternative method 30 adds a supercritical residue removal step 32 to the preferred method 20. The supercritical residue removal step 32 removes residue remaining on the substrate following a preceding etching step. In the preceding etching step, photoresist masks portions of the substrate so that only unmasked portions of the substrate are etched. The etching step also etches the photoresist, which is sometimes etched to completion. Generally, following the etching step there is some remaining photoresist on the substrate and there is also etch residue and photoresist residue on the substrate. Thus, the residue remaining on the substrate following the etching step includes the photoresist residue, the etch residue, and possibly the remaining photoresist. The supercritical residue removal step 32 comprises exposing the substrate with the residue to the supercritical carbon dioxide and a solvent until the residue is removed from the substrate. The supercritical residue removal step 32 is the subject of U.S. patent application Ser. No. 09/697,227 filed on Oct. 25, 2000, which is incorporated by reference in its entirety.

Figure 3:
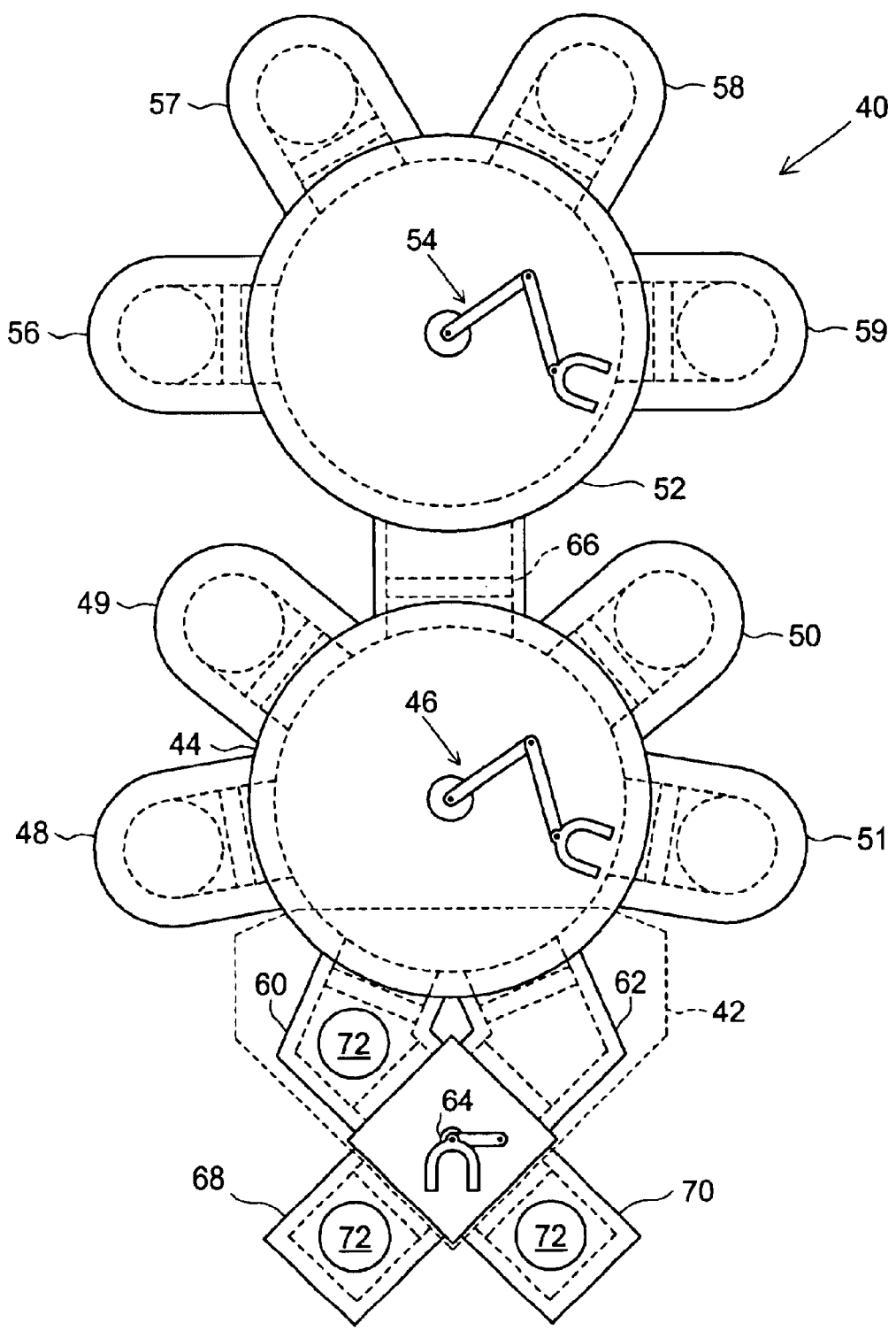
FIG. 3 illustrates the preferred metal deposition cluster tool of the present invention.

The preferred metal deposition cluster tool of the present invention is illustrated in FIG. 3. The preferred metal deposition cluster tool 40 comprises a loader module 42, a front transfer module 44, a front transfer module robot 46, first through fourth supercritical modules, 48–51, a back transfer module 52, a back transfer module robot 54, and first through fourth metal deposition modules, 56–59. The loader module 42 comprises first and second loadlocks, 60 and 62, and a loader robot 64. The first and second loadlocks, 60 and 62, comprise an entrance for the front transfer module.

The loader module 42, the front transfer module robot 46, the first through fourth supercritical modules, 48–51, are coupled to the front transfer module. The back transfer module 52 is coupled to the front transfer module via a valve 66. The back transfer module robot 54 and the first through fourth metal deposition modules 56–59 are coupled to the back transfer module 52.

In operation, first and second front opening unit pods (FOUP's), 68 and 70, employing a standard mechanical interface (SMIF) concept couple with the loader module 42. Preferably, the first pod 68 initially contains semiconductor substrates 72 which were etched, ashed, and cleaned in a wet clean process. The loader robot 64 transfers a semiconductor substrate 72 from the first pod 68 to the first loadlock 60. The loadlock 60 closes and is pumped to vacuum. The loadlock 60 is then opened to the front transfer module 46, which is at vacuum. The front transfer module robot 46 transfers the semiconductor substrate 72 to the first supercritical module 48 where the supercritical preclean and desorb steps, 22 and 24 (FIG. 1), take place. Meanwhile, additional semiconductor substrates are loaded from the first pod through the first loadlock 60 to the second through third supercritical modules, 49–51. Alternatively, the FOUP's are replaced by SMIF pods, or open cassettes.

Once the supercritical preclean and desorb steps, 22 and 24, are complete, the semiconductor substrate 72 is transferred from the first supercritical module 48 to the back transfer module robot 52 through the valve 66. The back transfer module 52 also operates at vacuum. The back transfer module robot 54 then transfers the semiconductor substrate 72 to the first metal deposition module 56 where the metal deposition step 26 (FIG. 1) takes place. Meanwhile, the additional semiconductor substrates are transferred from the second through third supercritical modules, 49–51, to the second through third metal deposition modules, 57–59.

Once the metal deposition step 26 is complete, the semiconductor substrate 72 is transferred from the first metal deposition module 56 to the first transfer module robot 46 by the second transfer module robot 54. The first transfer module robot 46 then transfers the semiconductor substrate 72 to the first loadlock 60, which is pressurized to atmosphere. The semiconductor substrate 72 is then transferred by the loader module robot 46 to the first pod 68. Subsequently, the additional semiconductor substrates are transferred from the second through third metal deposition modules, 57–59, to the first pod 68. Later, more semiconductor substrates are processed from the second pod 70 and then returned to the second pod 70.

It will be readily apparent to one skilled in the art that more or less supercritical processing modules can be coupled to front transfer module 44. Further, it will be readily apparent to one skilled in the art that more or less metal deposition module can be coupled to the back transfer module 52. Moreover, it will be readily apparent to one skilled in the art that a single loadlock for the front transfer module 44 will suffice for the entrance to the front transfer module 44.

In a first alternative metal deposition cluster tool, the front transfer module 44 operates at atmospheric pressure and provides an inert gas environment for the semiconductor wafer. In the first alternative metal deposition cluster tool, third and fourth loadlocks couple the front transfer module 44 to the back transfer module 52. Also in the first alternative metal deposition cluster tool, an inert gas injection arrangement is coupled to the front transfer module.

In a second alternative metal deposition cluster tool, the first and second supercritical processing modules, 48 and 49, and the first and second metal deposition modules, 56 and 57, are coupled to a single transfer module. The first alternative metal deposition tool is less preferred than the preferred metal deposition tool 40 because the preferred metal deposition tool separates the supercritical processing modules from the metal deposition modules by arranging the modules about respective transfer modules. This allows for a cleaner metal deposition process The first alternative metal deposition tool is taught in U.S. patent application Ser. No. 09/704,641 filed on Nov. 1, 2000, which is incorporated by reference in its entirety.

It will be readily apparent to one skilled in the art that other various modifications may be made to the preferred embodiment without departing from the spirit and scope of the invention as defined by the appended claims.

We claim:

1. A method of depositing a metal film on a substrate comprising the steps of:
   a. maintaining supercritical carbon dioxide and a chelating agent in contact with the substrate to remove an oxide layer from a metal surface of the substrate, thereby forming a precleaned substrate; and
   b. depositing the metal film on the precleaned substrate without exposing the precleaned substrate to a material which oxidizes the metal surface of the precleaned substrate.

2. The method of claim 1 wherein the step of maintaining the supercritical carbon dioxide and the chelating agent in contact with the substrate further comprises maintaining an acid in contact with the substrate such that the acid dissolves the oxide layer.

3. The method of claim 2 wherein the acid is selected from the group consisting of an organic acid and an inorganic acid.

4. The method of claim 2 wherein the oxide layer comprises a copper oxide.

5. The method of claim 4 wherein the acid comprises an organic acid.

6. The method of claim 4 wherein the acid is selected from the group consisting of acetic acid, formic acid, oxalic acid, malonic acid, alpha hydroxy acid, glycolic acid, citric acid, malic acid, lactic acid, amino acid, glycine, alanine, leucine, valine, glutamine, and lysine.

7. The method of claim 2 wherein the oxide layer comprises an aluminum oxide.

8. The method of claim 7 wherein the acid comprises an inorganic acid.

9. The method of claim 7 wherein the acid is selected from the group consisting of hydrofluoric acid, buffered hydrofluoric acid, ammonium fluoride, and ammonium bifluoride.

10. The method of claim 1 further comprising the step of maintaining the supercritical carbon dioxide in contact with the substrate to desorb an adsorbate from the substrate prior to the step of depositing the metal film.

11. The method of claim 10 wherein the step of maintaining the supercritical carbon dioxide in contact with the substrate desorbs an absorbate from the substrate.

12. The method of claim 1 further comprising the step of maintaining the supercritical carbon dioxide and a solvent in contact with the substrate to remove a residue selected from the group consisting of a photoresist, a photoresist residue, and an etch residue from the substrate prior to the step of depositing the metal film.

13. The method of claim 1 wherein the chelating agent is selected from the group consisting of 2,4-pentanedione, 1,1,1,6,6,6-hexafluoro-2,4-pentanedione, 1,1,1-trifluoropentane-2,4-dione, 2,6-dimethyltheptane-3,5-dione, 2,2,7-trimethyloctane-2,4-dione, 2,2,6,6- tetramethylheptane-3,5-dione, ethylenediamine diacetic acid, and nitrilotriacetic acid.

14. A method of depositing a metal film on a substrate comprising the steps of:
   a. maintaining supercritical carbon dioxide and an amine in contact with the substrate to remove an oxide layer from a metal surface of the substrate, thereby forming a precleaned substrate; and
   b. depositing the metal film on the precleaned substrate without exposing the precleaned substrate to a material which oxidizes the metal surface of the precleaned substrate.

15. The method of claim 14 wherein the amine is selected from the group consisting of triethanolamine, 2-methylaminoethanol, pyridine, 2,2'-bipyridine, and pentamethyldiethylenetriamine.

16. The method of claim 14 further comprising the step of maintaining the supercritical carbon dioxide in contact with the substrate to desorb an adsorbate from the substrate prior to the step of depositing the metal film.

17. The method of claim 16 wherein the step of maintaining the supercritical carbon dioxide in contact with the substrate desorbs an absorbate from the substrate.

18. The method of claim 14 further comprising the step of maintaining the supercritical carbon dioxide and a solvent in contact with the substrate to remove a residue selected from the group consisting of a photoresist, a photoresist residue, and an etch residue from the substrate prior to the step of depositing the metal film.

19. A method of depositing a film on a substrate comprising the steps of:
   a. maintaining supercritical carbon dioxide from a first module in contact with the substrate to remove a sorbate selected from the group consisting of an absorbate and an adsorbate from the substrate, thereby forming a desorbed substrate; and
   b. depositing the film on the desorbed substrate from a second module, wherein the substrate is transferred from the first module to the second module through a valve without exposure of the substrate to a surrounding environment.

20. The method of claim 19 where in the film comprises a metal film.

21. The method of claim 20 further comprising the step of maintaining the supercritical carbon dioxide and a chelating agent in contact with the substrate to remove an oxide layer from a metal surface of the substrate prior to the step of depositing the metal film on the substrate.

22. The method of claim 21 wherein the step of maintaining the supercritical carbon dioxide and the chelating agent in contact with the substrate further comprises maintaining an acid in contact with the substrate such that the acid dissolves the oxide layer.

23. The method of claim 20 further comprising the step of maintaining the supercritical carbon dioxide and an amine in contact with the substrate to remove an oxide layer from a metal surface of the substrate prior to the step of depositing the metal film on the substrate.

24. The method of claim 20 further comprising the step of maintaining the supercritical carbon dioxide and a solvent in contact with the substrate to remove a residue selected from the group consisting of a photoresist, a photoresist residue, and an etch residue from the substrate prior to the step of depositing the metal film.

25. A method of depositing a metal film on a substrate comprising the steps of:
   a. maintaining supercritical carbon dioxide in contact with the substrate to remove a sorbate selected from the group consisting of an absorbate and an adsorbate from the substrate;
   b. maintaining the supercritical carbon dioxide and a chelating agent in contact with the substrate to remove an oxide layer from a metal surface of the substrate; and
   c. subsequently depositing the metal film on the substrate without exposing the substrate to a first material which forms a nonvolatile sorbate prior to depositing the metal film and without exposing the substrate to a second material which forms the oxide prior to depositing the metal film.

26. The method of claim 25 wherein the step of maintaining the supercritical carbon dioxide and the chelating agent in contact with the substrate further comprises maintaining an acid in contact with the substrate such that the acid dissolves the oxide layer.

27. The method of claim 25 further comprising the step of maintaining the supercritical carbon dioxide and a solvent in contact with the substrate to remove a residue selected from the group consisting of a photoresist, a photoresist residue, and an etch residue from the substrate prior to the step of depositing the metal film.

28. A method of depositing a metal film on a substrate comprising the steps of:
   a. maintaining supercritical carbon dioxide in contact with the substrate to remove a sorbate selected from the group consisting of an absorbate and an adsorbate from the substrate;
   b. maintaining the supercritical carbon dioxide and an amine in contact with the substrate to remove an oxide layer from a metal surface of the substrate; and
   c. subsequently depositing the metal film on the substrate without exposing the substrate to a first material which forms a nonvolatile sorbate prior to depositing the metal film and without exposing the substrate to a second material which forms the oxide prior to depositing the metal film.

29. The method of claim 28 further comprising the step of maintaining the supercritical carbon dioxide and a solvent in contact with the substrate to remove a residue selected from the group consisting of a photoresist, a photoresist residue, and an etch residue from the substrate prior to the step of depositing the metal film.

30. A method of depositing a metal film on a substrate comprising the steps of:
   a. maintaining supercritical carbon dioxide, a chelating agent, and an acid in contact with the substrate such that the acid dissolves an oxide layer from a metal surface of the substrate and further such that the chelating agent carries away metal ions, thereby forming a precleaned substrate; and
   b. depositing the metal film on the precleaned substrate without exposing the precleaned substrate to a material which oxidizes the metal surface of the precleaned substrate.

31. An apparatus for depositing a metal film on a substrate comprising:
   a. a transfer module;
   b. a supercritical processing module coupled to the transfer module;
   c. a metal deposition module;
   d. a vacuum module coupling the metal deposition module to the transfer module;
   e. means for transferring the substrate between the supercritical processing module and the metal deposition module; and
   f. an inert gas injection arrangement coupled to the transfer module such that in operation the transfer module provides an inert gas environment.

32. The apparatus of claim 31 wherein the transfer module comprises an entrance and a first robot.

33. The apparatus of claim 32 wherein the entrance comprises a loadlock.

34. The apparatus of claim 33 further comprising a vacuum pump coupled to the transfer module such that in operation the transfer module operates at vacuum.

35. The apparatus of claim 32 wherein the vacuum module comprises a second robot.

36. The apparatus of claim 35 further comprising a valve, the valve coupling the transfer module to the vacuum module.

37. The apparatus of claim 36 further comprising a vacuum pump coupled to the vacuum module.

38. The apparatus of claim 35 further comprising a loadlock, the loadlock coupling the transfer module to the vacuum module.

39. The apparatus of claim 31 wherein the supercritical processing module comprises a pressure vessel.

40. An apparatus for depositing a metal film on a substrate comprising:
   a. a transfer module comprising an entrance and a first robot;
   b. a supercritical processing module coupled to the transfer module;
   c. a metal deposition module; and
   d. a vacuum module coupling the metal deposition module to the transfer module, the vacuum module comprising a vacuum chamber and a second robot, wherein the first robot and the second robot are configured to transfer the substrate between the supercritical processing module and the metal deposition module.

41. An apparatus comprising:
   a. a front transfer module comprising one or more supercritical modules configured to treat a substrate with a supercritical solution;
   b. a back transfer module coupled to the front transfer module, the back transfer module comprising one or more deposition modules configured to deposit a layer of material onto the treated substrate; and
   c. means for transferring the substrate between the front transfer module and the back transfer module without exposing the substrate to the environment.

42. The apparatus of claim 41, wherein the means for transferring the substrate between the first transfer module and the second transfer module comprises one or more transfer robots.

43. The apparatus of claim 41, further comprising a valve for isolating the substrate within the one of the front transfer module and the back transfer module.

44. The apparatus of claim 41, further comprising a loader module for introducing the substrate.

45. The apparatus of claim 44, wherein the loader module is coupled to the front transfer module.

* * * * *

UNITED STATES PATENT AND TRADEMARK OFFICE
CERTIFICATE OF CORRECTION

PATENT NO.        : 6,890,853 B2
APPLICATION NO.   : 09/841800
DATED             : May 10, 2005
INVENTOR(S)       : Maximillian A. Biberger et al.

It is certified that error appears in the above-identified patent and that said Letters Patent is hereby corrected as shown below:

On the title page, item [56] add the following references:

| | | | | |
|---|---|---|---|---|
| --4,592,306   | 06/03/86 | Gallego       | 118 | 719 |
| 4,670,126     | 06/02/87 | Messer et al. | 204 | 298 |
| 4,825,808     | 05/02/89 | Takahashi et al. | 118 | 719 |
| 4,951,601     | 08/28/90 | Maydan et al. | 118 | 719 |
| 5,934,856     | 08/10/99 | Asakawa et al.| 414 | 217 |
| 6,077,321     | 06/30/00 | Adachi et al. | 29  | 25.01 |
| EP 0 244 951 A2 | 11/11/87 | EP | H 01 L | 21/00 |
| EP 0 272 141 A2 | 06/22/88 | EP | H 01 L | 21/00 |
| GB 2 193 482 A  | 02/10/88 | GB | B 25 J | 18/02 |
| JP 10-144757    | 05/29/98 | JP | H 01 L | 21/68 |
| JP 56-142629    | 11/07/81 | JP | H 01 L | 21/205 |
| JP 60-238479    | 11/27/85 | JP | C 23 C | 14/56 |
| JP 60-246635    | 12/06/85 | JP | H 01 L | 21/302 |
| JP 61-231166    | 10/15/86 | JP | C 23 C | 14/24 |
| JP 63-303059    | 12/09/88 | JP | C 23 C | 14/22 |

UNITED STATES PATENT AND TRADEMARK OFFICE
CERTIFICATE OF CORRECTION

PATENT NO. : 6,890,853 B2  
APPLICATION NO. : 09/841800  
DATED : May 10, 2005  
INVENTOR(S) : Maximillian A. Biberger et al.

It is certified that error appears in the above-identified patent and that said Letters Patent is hereby corrected as shown below:

| | | | | |
|---|---|---|---|---|
| WO 87/07309 | 12/03/87 | WO | C 23 C | 16/00 |
| WO 91/12629 | 08/22/91 | WO | H 01 L | 21/00 |
| WO 99/18603 | 04/15/99 | WO | H 01 L | 21/00 |

Hideaki Itakura et al., "Multi-Chamber Dry Etching System", Solid State Technology, April 1982, pp. 209-214--.

Column 1, line 13, replace "deposition of film" with --deposition of films--.

Column 8: In Claim 13, replace "2,6-dimethyltheptane-3,5-dione" with --2,6-dimethylheptane-3,5-dione--.

Signed and Sealed this

Seventeenth Day of October, 2006

JON W. DUDAS  
*Director of the United States Patent and Trademark Office*

UNITED STATES PATENT AND TRADEMARK OFFICE
CERTIFICATE OF CORRECTION

PATENT NO. : 6,890,853 B2  Page 1 of 1
APPLICATION NO. : 09/841800
DATED : May 10, 2005
INVENTOR(S) : Maximillian A. Biberger et al.

It is certified that error appears in the above-identified patent and that said Letters Patent is hereby corrected as shown below:

On the title page, item [56] add --6,001,133  12/14/1999  DeYoung et al.--

Signed and Sealed this

Eighteenth Day of March, 2008

JON W. DUDAS
*Director of the United States Patent and Trademark Office*